United States Patent
Gorobets (10) Patent No.: US 7,212,440 B2
(45) Date of Patent: May 1, 2007

(54) ON-CHIP DATA GROUPING AND ALIGNMENT

(75) Inventor: Sergey Anatolievich Gorobets, Edinburgh (GB)

(73) Assignee: SanDisk Corporation, Milpitas, CA (US)

(*) Notice: Subject to any disclaimer, the term of this patent is extended or adjusted under 35 U.S.C. 154(b) by 80 days.

(21) Appl. No.: 11/026,549

(22) Filed: Dec. 30, 2004

(65) Prior Publication Data

US 2006/0149890 A1    Jul. 6, 2006

(51) Int. Cl.
 *G11C 11/34* (2006.01)
(52) U.S. Cl. .............. 365/185.11; 365/189.04; 711/103
(58) Field of Classification Search .......... 365/185.11, 365/200, 238.5, 239, 189.04; 711/103, 170
See application file for complete search history.

(56) References Cited

U.S. PATENT DOCUMENTS

| | | |
|---|---|---|
| 5,233,616 A | 8/1993 | Callander |
| 5,267,242 A | 11/1993 | Lavallee et al. |
| 5,274,646 A | 12/1993 | Brey et al. |
| 5,465,235 A | 11/1995 | Miyamoto |
| 5,734,816 A | 3/1998 | Niijima et al. |
| 5,768,194 A | 6/1998 | Matsubara et al. |
| 5,777,923 A * | 7/1998 | Lee et al. ............ 365/185.11 |
| 5,822,245 A | 10/1998 | Gupta et al. |
| 5,873,126 A | 2/1999 | Singh |
| 5,890,192 A | 3/1999 | Lee et al. |
| 5,930,167 A | 7/1999 | Lee et al. |
| 6,021,463 A | 2/2000 | Belser |
| 6,040,997 A | 3/2000 | Estakhri |
| 6,101,624 A | 8/2000 | Cheng et al. |
| 6,181,598 B1 | 1/2001 | Matsubara et al. |
| 6,266,273 B1 | 7/2001 | Conley et al. |
| 6,282,624 B1 | 8/2001 | Kimura et al. |
| 6,317,371 B2 | 11/2001 | Katayama et al. |
| 6,374,337 B1 | 4/2002 | Estakhri |
| 6,388,920 B2 | 5/2002 | Katayama et al. |
| 6,421,279 B1 | 7/2002 | Tobita et al. |
| 6,426,893 B1 * | 7/2002 | Conley et al. ......... 365/185.11 |
| 6,449,625 B1 | 9/2002 | Wang |
| 6,456,528 B1 | 9/2002 | Chen |

(Continued)

FOREIGN PATENT DOCUMENTS

DE    246857    6/1987

(Continued)

OTHER PUBLICATIONS

Nakamura et al., "A Novel Sense Amplifier for Flexible Voltage Operation NAND Flash Memories," 1995 *Symposium on VLSI Circuits Digest of Technical Papers*, Jun. 8-10, 1995, pp. 71-72.

(Continued)

*Primary Examiner*—Anh Phung
*Assistant Examiner*—Dang Nguyen
(74) *Attorney, Agent, or Firm*—Parsons Hsue & de Runtz LLP (57) ABSTRACT

The invention describes the method for regrouping data read from multi-sector pages inside a memory chip. As a result, garbage collection operation time greatly reduces and overall system performance increases. Architectural features include the ability to selectively transfer individual data sectors of a page between on-chip registers and the ability to realign data sectors within a register.

33 Claims, 6 Drawing Sheets

U.S. PATENT DOCUMENTS

| | | | |
|---|---|---|---|
| 6,490,649 | B2 | 12/2002 | Sinclair |
| 6,522,586 | B2 | 2/2003 | Wong |
| 6,525,952 | B2 | 2/2003 | Araki et al. |
| 6,581,142 | B1 | 6/2003 | Jacobs |
| 6,614,715 | B2 * | 9/2003 | Tsao et al. ............... 365/238.5 |
| 2002/0124143 | A1 | 9/2002 | Barroso et al. |
| 2003/0065899 | A1 | 4/2003 | Gorobets |
| 2003/0070036 | A1 | 4/2003 | Gorobets |
| 2003/0099134 | A1 | 5/2003 | Lasser et al. |

FOREIGN PATENT DOCUMENTS

| | | |
|---|---|---|
| EP | 0674266 | 9/1995 |
| EP | 1008940 | 6/2000 |
| EP | 1569124 | 8/2005 |
| JP | 5282883 | 10/1993 |
| JP | 11003290 | 11/1999 |
| JP | 2001 297447 A | 10/2001 |
| KR | 2001 037452 A | 5/2001 |
| WO | WO 99/44133 | 9/1999 |
| WO | WO 00/49488 | 8/2000 |
| WO | WO 00/67137 | 11/2000 |
| WO | WO 02/49039 A2 | 6/2002 |
| WO | WO 02/058074 A2 | 7/2002 |
| WO | WO 03/029951 A2 | 4/2003 |
| WO | WO 03/069627 A1 | 8/2003 |

OTHER PUBLICATIONS

Srisa-an et al., "Performance Enhancements to the Active Memory System," *2002 IEEE International Conference on Computer Design: VLSI in Computers and Processors*, Sep. 16-18, 2002, pp. 249-256.

Lee et al., "High-Performance 1-Gb NAND Flash Memory with 0.12- μm Technology," *Journal of Solid-State Circuits*, Nov. 2002, vol. 37, No. 11, pp. 1502-1509.

Imamiya et al., "A 125-mm$^2$ 1-Gb NAND Flash Memory with 10/Mbyte/s Program Speed," *IEEE Journal of Solid State Circuits*, vol. 37, No. 11, Nov. 2002, pp. 1493-1501.

Communication Relating to the Results of the partial International Search for SanDisk Corporation, International Application No. PCT/US2005/047456 mailed Jun. 20, 2006, 2 pages.

Notification of Transmittal of the International Search Report and the Written Opinion of the International Searching Authority, or the Declaration for SanDisk Corporation, International Application No. PCT/US2005/047456 mailed Jul. 21, 2006, 17 pages.

* cited by examiner

ON-CHIP DATA GROUPING AND ALIGNMENT

BACKGROUND OF THE INVENTION

This invention pertains to the field of semiconductor non-volatile data storage system architectures and their methods of operation, and has application to data storage systems based on flash electrically erasable and programmable read-only memories (EEPROMs) and other types of memory system.

A common application of flash EEPROM devices is as a mass data storage subsystem for electronic devices. Such subsystems are commonly implemented as either removable memory cards that can be inserted into multiple host systems or as non-removable embedded storage within the host system. In both implementations, the subsystem includes one or more flash devices and often a subsystem controller.

Flash EEPROM devices are composed of one or more arrays of transistor cells, each cell capable of non-volatile storage of one or more bits of data. Thus flash memory does not require power to retain the data programmed therein. Once programmed however, a cell must be erased before it can be reprogrammed with a new data value. These arrays of cells are partitioned into groups to provide for efficient implementation of read, program and erase functions. A typical flash memory architecture for mass storage arranges large groups of cells into erasable blocks, wherein a block contains the smallest number of cells (unit of erase) that are erasable at one time.

In one commercial form, each block contains enough cells to store one sector of user data plus some overhead data related to the user data and/or to the block in which it is stored. The amount of user data included in a sector is the standard 512 bytes in one class of such memory systems but can be of some other size. Because the isolation of individual blocks of cells from one another that is required to make them individually erasable takes space on the integrated circuit chip, another class of flash memories makes the blocks significantly larger so there is less space required for such isolation. But since it is also desired to handle user data in much smaller sectors, each large block is often further partitioned into individually addressable pages that are the basic unit for reading and programming user data; although the size of a write page need not be the same as the size of a read page, in the following they are treated as being the same in order to simplify the discussion. Each page usually stores one sector of user data, but a page may store a partial sector or multiple sectors. A "sector" is used herein to refer to an amount of user data that is transferred to and from the host as a unit.

The subsystem controller in a large block system performs a number of functions including the translation between logical addresses (LBAs) received by the memory sub-system from a host, and physical block numbers (PBNs) and page addresses within the memory cell array. This translation often involves use of intermediate terms for a logical block number (LBN) and logical page. The controller also manages the low level flash circuit operation through a series of commands that it issues to the flash memory devices via an interface bus. Another function the controller performs is to maintain the integrity of data stored to the subsystem through various means, such as by using an error correction code (ECC).

Figure 1:
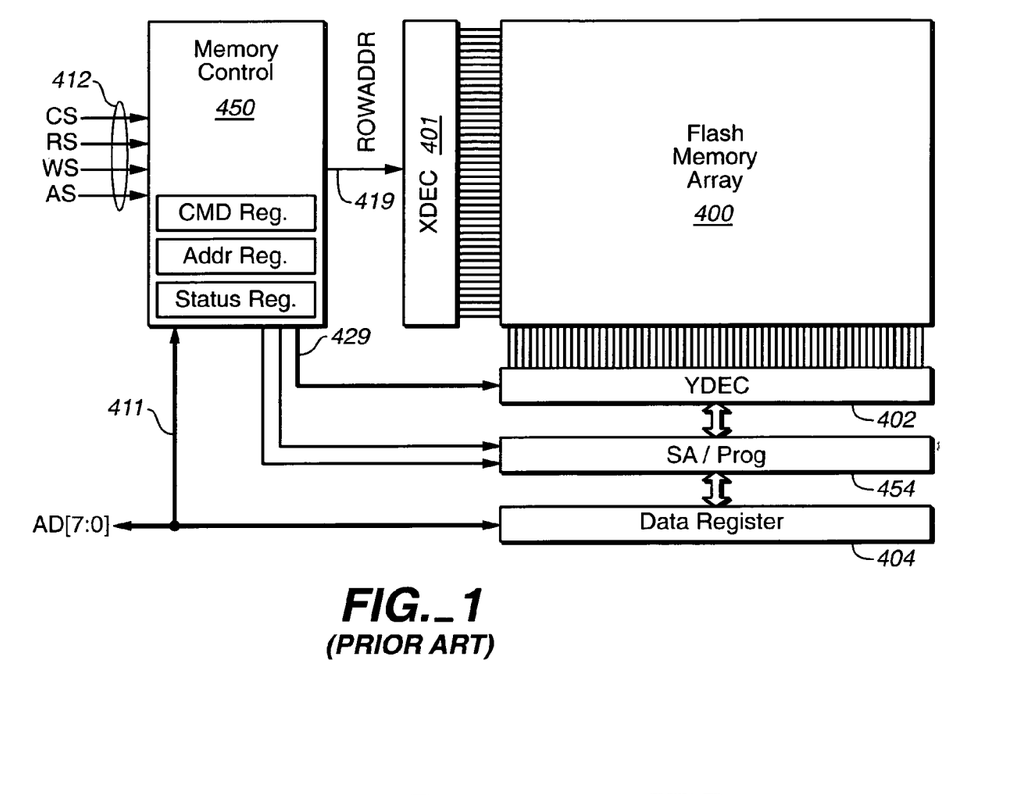
FIG. 1 is a block diagram of a typical prior art flash EEPROM memory array with memory control logic, data and address registers.

FIG. 1 shows a typical internal architecture for a flash memory device 131. The primary features include an input/output (I/O) bus 411 and control signals 412 to interface to an external controller, a memory control circuit 450 to control internal memory operations with registers for command, address and status signals. One or more arrays 400 of flash EEPROM cells are included, each array having its own row decoder (XDEC) 401 and column decoder (YDEC) 402, a group of sense amplifiers and program control circuitry (SA/PROG) 454 and a data register 404. Presently, the memory cells usually include one or more conductive floating gates as storage elements but other long-term electron charge storage elements may be used instead. The memory cell array may be operated with two levels of charge defined for each storage element to therefore store one bit of data with each element. Alternatively, more than two storage states may be defined for each storage element, in which case more than one bit of data is stored in each element.

If desired, a plurality of arrays 400, together with related X decoders, Y decoders, program/verified circuitry, data registers, and the like are provided, for example as taught by U.S. Pat. No. 5,890,192, issued Mar. 30, 1999, and assigned to SanDisk Corporation, the assignee of this application, which is hereby incorporated by this reference. Related memory system features are described in U.S. Pat. No. 6,426,893, issued Jul. 30, 2002, and assigned to SanDisk Corporation, the assignee of this application, which application is also expressly incorporated herein by this reference. These patents describe having multiple semi-autonomous arrays, referred to as planes or "quads" on a single memory chip.

The external interface I/O bus 411 and control signals 412 can include the following:

| | |
|---|---|
| CS—Chip Select. | Used to activate flash memory interface. |
| RS—Read Strobe. | Used to indicate the I/O bus is being used to transfer data from the memory array. |
| WS—Write Strobe. | Used to indicate the I/O bus is being used to transfer data to the memory array. |
| AS—Address Strobe. | Indicates that the I/O bus is being used to transfer address information. |
| AD[7:0]—Address/ Data Bus | This I/O bus is used to transfer data between controller and the flash memory command, address and data registers of the memory control 450. |

In addition to these signals, it is also typical that the memory have a means by which the storage subsystem controller may determine that the memory is busy performing some task. Such means could include a dedicated signal or a status bit in an internal memory register that is accessible while the memory is busy.

This interface is given only as an example as other signal configurations can be used to give the same functionality. FIG. 1 shows only one flash memory array 400 with its related components, but a multiplicity of such arrays can exist on a single flash memory chip that share a common interface and memory control circuitry but have separate XDEC 401, YDEC 402, SA/PROG 454 and DATA REG 404 circuitry in order to allow parallel read and program operations. More generally, there may be one or two additional such data registers typically arranged into the sort of master slave arrangements developed further in U.S. Pat. No. 6,560,143, which is hereby incorporated by reference.

Data is transferred from the memory array through the data register 404 to an external controller via the data registers' coupling to the I/O bus AD[7:0] 411. The data register 404 is also coupled the sense amplifier/programming circuit 454. The number of elements of the data register coupled to each sense amplifier/programming circuit element may depend on the number of bits stored in each storage element of the memory cells, flash EEPROM cells each containing one or more floating gates as the storage elements. Each storage element may store a plurality of bits, such as 2 or 4, if the memory cells are operated in a multi-state mode. Alternatively, the memory cells may be operated in a binary mode to store one bit of data per storage element.

The row decoder 401 decodes row addresses for the array 400 in order to select the physical page to be accessed. The row decoder 401 receives row addresses via internal row address lines 419 from the memory control logic 450. A column decoder 402 receives column addresses via internal column address lines 429 from the memory control logic 450.

Figure 2:
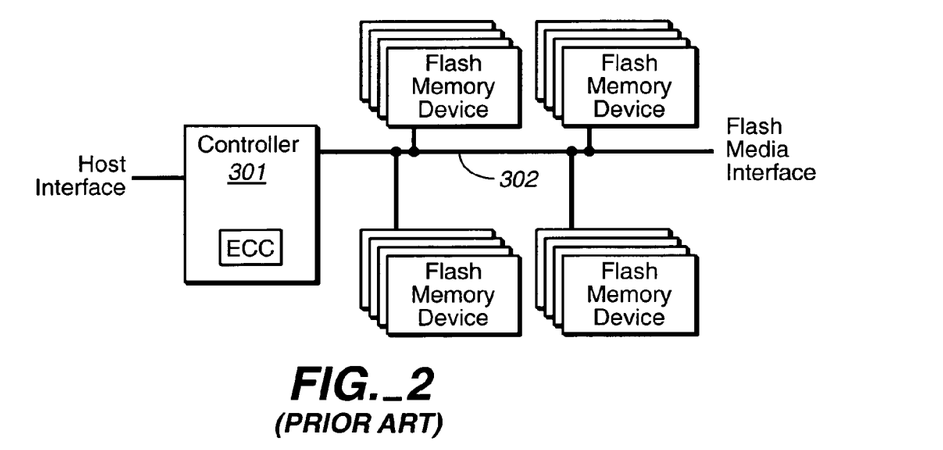
FIG. 2 illustrates an architecture utilizing memories of FIG. 1 with a system controller.

FIG. 2 shows an architecture of a typical non-volatile data storage system, in this case employing flash memory cells as the storage media. In one form, this system is encapsulated within a removable card having an electrical connector extending along one side to provide the host interface when inserted into a receptacle of a host. Alternatively, the system of FIG. 2 may be embedded into a host system in the form of a permanently installed embedded circuit or otherwise. The system utilizes a single controller 101 that performs high-level host and memory control functions. The flash memory media is composed of one or more flash memory devices, each such device often formed on its own integrated circuit chip. The system controller and the flash memory are connected by a bus 121 that allows the controller 101 to load command, address, and transfer data to and from the flash memory array. (The bus 121 includes 412 and 411 of FIG. 1.) The controller 101 interfaces with a host system (not shown) with which user data is transferred to and from the flash memory array. In the case where the system of FIG. 2 is included in a card, the host interface includes a mating plug and socket assembly (not shown) on the card and host equipment.

The controller 101 receives a command from the host to read or write one or more sectors of user data starting at a particular logical address. This address may or may not align with the first physical page in a block of memory cells.

In some prior art systems having large capacity memory cell blocks that are divided into multiple pages, the data from a block that is not being updated needs to be copied from the original block to a new block that also contains the new, updated data being written by the host. In other prior art systems, flags are recorded with the user data in pages and are used to indicate that pages of data in the original block that are being superceded by the newly written data are invalid. A mechanism by which data that partially supercedes data stored in an existing block can be written without either copying unchanged data from the existing block or programming flags to pages that have been previously programmed is described in co-pending patent application "Partial Block Data Programming and Reading Operations in a Non-Volatile Memory", Ser. No. 09/766, 436, filed Jan. 19, 2001 by Kevin Conley, which application is expressly incorporated herein by this reference.

Non-volatile memory systems of this type are being applied to a number of applications, particularly when packaged in an enclosed card that is removable connected with a host system. Current commercial memory card formats include that of the Personal Computer Memory Card International Association (PCMCIA), CompactFlash (CF), MultiMediaCard (MMC) and Secure Digital (SD). One supplier of these cards is SanDisk Corporation, assignee of this application. Host systems with which such cards are used include personal computers, notebook computers, hand held computing devices, cameras, audio reproducing devices, and the like. Flash EEPROM systems are also utilized as bulk mass storage embedded in host systems.

Such non-volatile memory systems include one or more arrays of floating-gate memory cells and a system controller. The controller manages communication with the host system and operation of the memory cell array to store and retrieve user data. The memory cells are grouped together into blocks of cells, a block of cells being the smallest grouping of cells that are simultaneously erasable. Prior to writing data into one or more blocks of cells, those blocks of cells are erased. User data are typically transferred between the host and memory array in sectors. A sector of user data can be any amount that is convenient to handle, preferably less than the capacity of the memory block, often being equal to the standard disk drive sector size, 512 bytes. In one commercial architecture, the memory system block is sized to store one sector of user data plus overhead data, the overhead data including information such as an error correction code (ECC) for the user data stored in the block, a history of use of the block, defects and other physical information of the memory cell block. Various implementations of this type of non-volatile memory system are described in the following United States patents and pending applications assigned to SanDisk Corporation, each of which is incorporated herein in its entirety by this reference: U.S. Pat. Nos. 5,172,338, 5,602,987, 5,315,541, 5,200,959, 5,270,979, 5,428,621, 5,663,901, 5,532,962, 5,430,859 and 5,712,180, and application Ser. No. 08/910,947, filed Aug. 7, 1997, and Ser. No. 09/343,328, filed Jun. 30, 1999. Another type of non-volatile memory system utilizes a larger memory cell block size that stores multiple sectors of user data.

One architecture of the memory cell array conveniently forms a block from one or two rows of memory cells that are within a sub-array or other unit of cells and which share a common erase gate. U.S. Pat. Nos. 5,677,872 and 5,712,179 of SanDisk Corporation, which are incorporated herein in their entirety, give examples of this architecture. Although it is currently most common to store one bit of data in each floating gate cell by defining only two programmed threshold levels, the trend is to store more than one bit of data in each cell by establishing more than two floating-gate transistor threshold ranges. A memory system that stores two bits of data per floating gate (four threshold level ranges or states) is currently available, with three bits per cell (eight threshold level ranges or states) and four bits per cell (sixteen threshold level ranges) being contemplated for future systems. Of course, the number of memory cells required to store a sector of data goes down as the number of bits stored in each cell goes up. This trend, combined with a scaling of the array resulting from improvements in cell structure and general semiconductor processing, makes it practical to form a memory cell block in a segmented portion of a row of cells. The block structure can also be formed to enable selection of operation of each of the memory cells in two states (one data bit per cell) or in some multiple such as four states (two data bits per cell), as described in SanDisk Corporation U.S. Pat. No. 5,930,167, which is incorporated herein in its entirety by this reference.

In addition to increasing the capacity of such non-volatile memories, there is a search to also improve such memories by increasing their performance and decreasing their susceptibility to error. Memories such as those described above that utilize large block management techniques perform a number of data management of techniques on the memory's file system, including garbage collection, in order to use the memory area more effectively. Such garbage collection schemes involve a data relocation process including reading data from one (or more) locations in the memory and re-writing it into another memory location. (In addition to many of the above incorporated references, garbage collection is discussed further in, for example, "A 125-mm² 1-Gb NAND Flash Memory With 10-MByte/s Program Speed", by K. Imamiya, et al., IEEE Journal of Solid-State Circuits, Vol. 37, No. 11, November 2002, pp. 1493–1501, which is hereby incorporated in its entirety by this reference.) This data relocation time is a main contributor to all garbage collection routines. Prior art methods describe the data relocation operation as a consecutive data read, then data integrity check and error correction, if necessary, before writing the data to a new location, so that there is a high constant performance penalty of data transfer and verification. In the case of data error, additional time must be spent to correct the data before write.

Other prior art methods exploit an on-chip copy feature, writing the data from one location to another without a pre-check of the data integrity. Such a method is described, for example, in "High Performance 1-Gb NAND Flash Memory With 0.12 µm Technology", by J. Lee, et al., IEEE Journal of Solid-State Circuits, Vol. 37, No. 11, November 2002, pp. 1502–1509, which is hereby incorporated in its entirety by this reference. The integrity check is done concurrently with the data write so that, in the case of error, there is a high probability of the need to rewrite the entire block with a high penalty in performance and time-out/latency.

Figure 3:
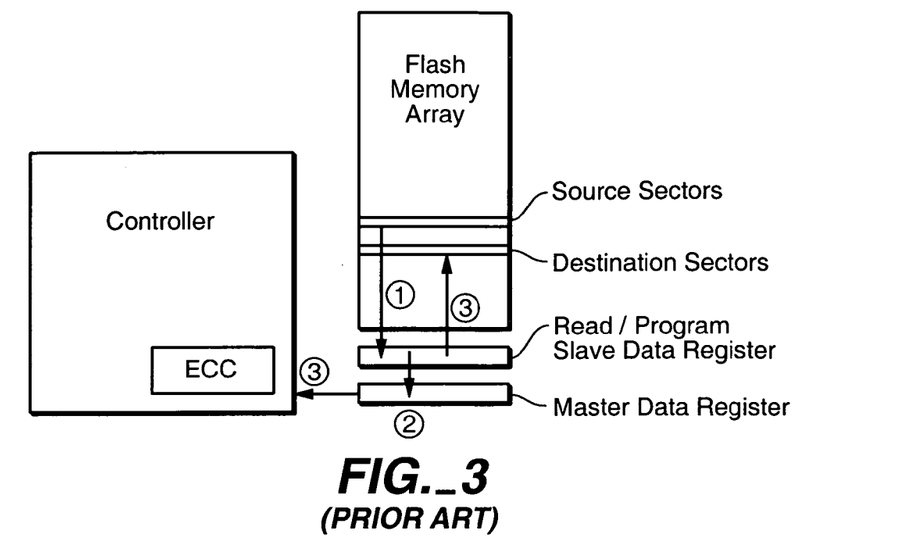
FIG. 3 shows an example of an on-copy sequence in the prior art.

A particular on-chip copy mechanism, shown in FIG. 3, and is presented in more detail in U.S. Pat. No. 6,266,273. As indicated by step (1) in FIG. 3, a data set is read from a source location to a read/program slave data register. The architecture shown in FIG. 3 uses a master-slave arrangement for its data registers and the read copy of the data set is transferred in step (2) to the master register. In step (3), the copied data set is then relocated to the destination location and, if desired, in parallel with transferring it from the master data register to the controller. This technique allows for on-chip relocation while also transferring a copy of the data to the controller where it can be checked.

The architecture of a multi-plane small block or big block memory allows multi-sector reads and programs, where the unit of reading and programming, or "page", is made up of multiple sectors of data. As the data in some of these sectors is updated, this can result in some sectors of a page being current while others while others are obsolete. In current techniques, when an on-chip copy operation is performed, an entire page is read and then re-written. Consequently, prior art methods do not help much in the consolidation of randomly scattered or misaligned data in memory and relocation of this data to another location (a garbage collection operation); if the data to be relocated needs to be regrouped, it has to be transferred to controller and back for any such data regrouping. Consequently, the operation of such memory systems could be greatly improved if on-ship data relocation operations could be improved to include such data realignment.

SUMMARY OF THE INVENTION

According to one principal aspect of the present invention, briefly and generally, the present invention describes the method for regrouping data read from multi-sector pages inside a memory chip. By consolidating randomly scattered or misaligned data in a memory within data registers on the memory and relocating this data to another location, garbage collection operation time is greatly reduced and overall system performance increases.

In a principle first aspect, the memory architecture features data registers (such as a master-slave arrangement) where individual data sectors of a page can selectively be transferred using a masking mechanism. In another aspect, the memory architecture allows the realignment of data sectors within one of the memory's registers; for example, allowing the cyclical rotation of sectors within a page of data stored in the register. In a third aspect, concurrently with the data realignment, data can be transferred to the controller, where an error detection and correction operation can be performed.

The method described here allows data from a plurality of pages to be read into the memory registers, realigned and combined within them, and written back as a single page to the memory. The result is an on-chip garbage collection technique that can be used alone or combined with other techniques to improve performance in memory systems that manipulate data in multi-sector units.

Several alternate embodiments extend the memory architecture allowing individual data sectors of a page to be selectively transferred to multi-array implementations. Through use of off-chip data copy techniques or a ring bus structure, data may be realigned between the components of the data page.

Additional aspects, features and advantages of the present invention are included in the following description of exemplary embodiments, which description should be read in conjunction with the accompanying drawings.

DESCRIPTION OF EXEMPLARY EMBODIMENTS OF THE INVENTION

The present invention provides methods and structures that allow it to consolidate on the chip valid sectors from several pages. As noted in the Background, the architecture of multi-plane small block or big block memory allows multi-sector reads and programs. However, as found in the prior art, the consolidation of randomly scattered or misaligned data in the memory and relocation of this data to another location in a garbage collection operation cannot be performed on-chip. If the data to be relocated needs to be regrouped, transfers of the data to controller and back are required for data regrouping. The methods of the present invention can significantly accelerate garbage collection operations by doing such data regrouping on chip. The invention describes the method for regrouping data read from multi-sector pages inside a memory chip. As a result, garbage collection operation time greatly reduces and overall system performance increases.

A number of techniques related to data relocation operations that can be combined with the various aspects of the present invention are found in U.S. patent applications Ser. No. 10/846,289, filed May 13, 2004; one entitled "Method for Copying Data in Reprogrammable Non-Volatile Memory", by Andy Tomlin, file Dec. 21, 2004; one entitled "Off-Chip Data Relocation" by Peter Smith and Kevin Conley, filed Dec. 21, 2004; and U.S. Pat. No. 6,266,273, all of which are hereby incorporated by reference. In particular, U.S. patent application Ser. No. 10/846,289 presents a number of architectural improvements that can be advantageously combined with the present invention, as is described further below.

Figure 4:
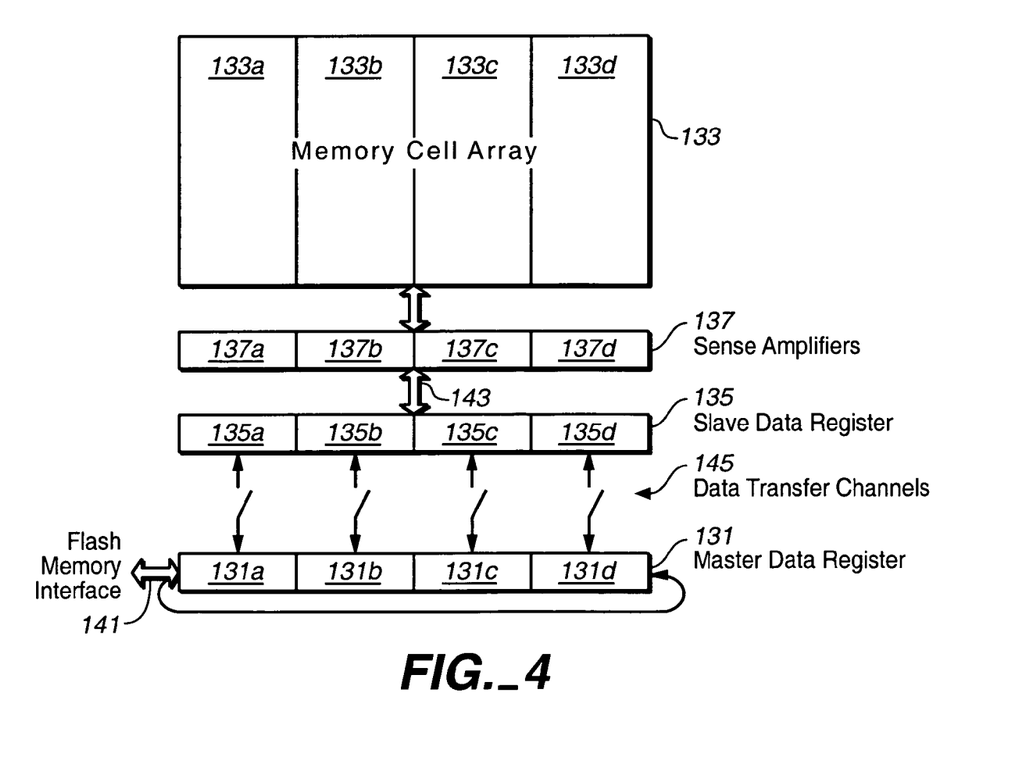
FIG. 4 is a block diagram showing an exemplary embodiment of a memory.

A basic embodiment of the method is based on the memory architecture as described with respect to FIG. 4. The schematic diagram shows a memory having a master-slave arrangement for the data registers, as several aspects of the present invention are readily illustrated in such a two-register setup. Memory array 133 is organized where each page holds multiple (here four) sectors in each unit of write and the exemplary embodiment is based on a non-volatile flash memory technology, although the methods readily extend to other memory types as the main aspects of the present invention are not particularly specific to a single technology for the storage elements. The sector-sized portions are indicated as 133a, 133b, 133c, and 133d. The following description uses the sector as the division of the page, as this is the unit of data transfer between the memory system and the host, although other subdivisions of the page could be used. (The page is the unit of read and write, here the read and write page are taken to be of the same size.)

During a read, when data is transferred to the slave register 135 from the array 133, the sectors comprising a page are read by sense amplifiers 137 to the slave data register 135. The sector corresponding to portion 133a of the memory is transferred by 137a to segment 135a of the slave register, with the other sectors of the page similarly going to the corresponding portions of the slave data register. The sectors can then be transferred from the slave register 135 to the master data register, from where it can be exchanged along 141 through the flash memory interface and on to the controller and host. Similarly, during a write of data, the data is received over bus 141 and accumulated in the master data register 131, transferred to the slave register 135, and then programmed in the host. As described in the Background with respect to FIG. 3, in an on-chip data relocation the data may instead have originated in the array 133 in a read operation.

In previous arrangements using multi-sector pages, when a page is transferred from the master data register 131 to the slave data register 135 and on to the array 133 in a write process, the whole page travels as a unit and maintains a fixed relation: the sector from 131a goes to 135a and is programmed into 133a, and similarly for the b, c, and d sectors. Similarly, in a read process the whole page transfer as a unit from array 133 to sense amps 137 and on to the slave and master registers, with the a, b, c, and d sectors maintaining there alignment. Principle aspects of the present invention break this fixed link by allowing selective transfer at the sector-level between one or more of these elements and allowing the realignment of the sector order in one register with respect to another. These changes allow for the on-chip data alignment of sectors for the consolidation of randomly scattered or misaligned data in the memory and relocation of this data to another location as part of a garbage collection operation. The following discussion will be based on a page composed of components, each component being a sector. More generally, it is readily extended to other numbers of components per page and components of different sizes. For example, instead of storing a single sector per memory plane, multiple sectors may be stored in each plane.

More specifically, the memory architecture features the ability to read and program multi-sector pages, here taken as the four sectors identified as a, b, c, d. The memory incorporates individual sector data transfer channels between the multi-sector slave register 135 and master data register 131, where the transfers in different channels can be done in parallel and the transfer operation in every individual channel can be selectively disabled/enabled. In the exemplary embodiment, the selective transfer is implemented in the Data Transfer Channels 145 between the two registers, although other embodiment could implement this elsewhere in the read-write path, for example in 143.

The architecture also allows the sectors in at least one data register to be shifted around. In the exemplary embodiment, the master data register 131 can cyclically shift the data around by a fixed number of sectors (sector data lengths) as indicated by the arrow. This allows the alignment of the content of sectors a, b, c, d in the master register 131 to be changed with respect to the salve data register 135. As an optional feature, the memory allows data to be transferred to and from the memory via the flash memory interface in parallel with the data rotation/shift.

These features allow reading the source pages into the slave data register, the transfer data for individually selected sectors to the master data register, regrouping and alignment of the data by rotation within the master data register, and then, programming the data to the destination page. Optionally, the data can be transferred to the controller/host for error detection/correction or/and modification, and then back to the memory prior to programming operation.

Figure 5:
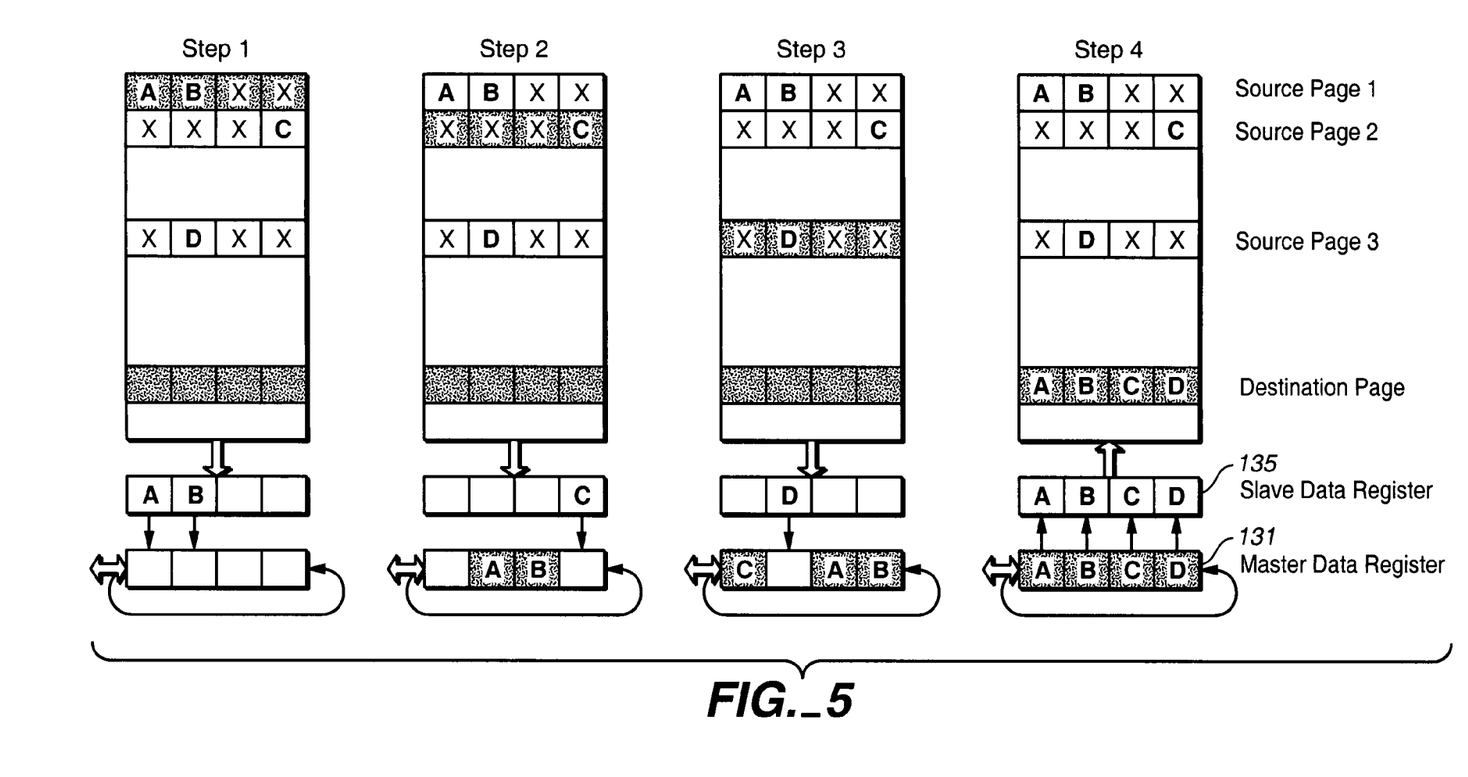
FIG. 5 illustrates an example of the operation of the memory shown in FIG. 4.

FIG. 5 illustrates an example of on-chip garbage collection operations, where four sectors (A, B, C and D) are collected from three different pages, regrouped and programmed to another page. In the example, a first source page contains valid sectors A and B, the second source page valid sector C, and the third page valid sector D. The x represents a sector that is obsolete (or otherwise not to be written into the destination sector.) The goal is to combine these four sectors in the same page, aligned A-B-C-D, and the to write them to a specified destination page in respective locations 133a–d of that page. In the prior art, this would require the transfer of the source pages out of the memory for their alignment and combination onto the same page.

In Step 1, Source Page 1 is read to Slave Data Register 135. In the exemplary embodiment, all of source page is read into the slave register, although only the sectors A and B are shown. In a variation, the sectors of a page could selectively be read. Next the sectors A and B transferred from 137a and 137b to portions 131a and 131b of the Master Data Register 131. Data in the Master Data Register is then rotated in order to align sectors A and B with the original position of sector C in Source Page 2. (The order of the rotation of sectors A and B in the Master Data Register and the reading of the second source page can be switched, or done concurrently if the architecture allows.) Optionally, the sectors A and B data can be transferred to the controller/host in parallel with the rotation for error detection/correction.

In Step 2, Source Page 2 is read to Slave Data Register and then transferred to the Master Data Register, where the sectors A and B have previously been aligned. Data in the Master Data Register is rotated in order to align sector A, B and C with the original position of sector D in its source page. Optionally, the sector C data can be transferred to the controller/host in parallel with the rotation for error detection/correction. Also, if the sectors A and B were found to be corrupted and were corrected in parallel with the Source Page 2 read, their data can be transferred back to the Master Data Register.

In Step 3, Source Page 3 is read to Slave Data Register and the data of of sector D transferred to the Master Data Register. Once the Master Data Register is full (or as full as intended, in case a less than full page is to be written), the data in the Master Data Register is rotated in order to align sector A, B, C and D with the required position of the sectors in the destination page. Optionally, the sector D data can be transferred to the controller/host in parallel with the rotation for error detection/correction. Also, if the sector C was found to be corrupted and was corrected in parallel with the Source Page 3 read, its data can be transferred back to the Master Data Register. Sector D data can also be transferred back to flash memory if it was corrected/modified.

In Step 4, the contents Destination Page data is programmed to Slave Data Register and from there on to the Destination Page itself.

As noted above, the data rotation mechanism and the ability to selectively transfer portions of a data page are independent aspects of the present invention. Together, they allow the grouping and alignment of misaligned data. If the data is aligned (so that sector A is always in the plane 0, B in plane 1, C in 2, D in 3) but scattered across several rows, which is often the case, then there is no need in the data rotation mechanism and a masking mechanism alone will enable on-chip data collection.

A number of different masking schemes are available, particularly when the sectors do not need to be realigned. For example, one embodiment allowing for a fairly simple masking control is when the data to be written is collected form left to right only: First, the row containing sector A is transferred to slave register 135, the other sectors masked, and only sector A is transferred to master register 131 (135a to 131a); next, the row containing sector B is transferred to slave register 135, the other sectors masked, and only sector B is transferred to master register 131 (135b to 131b); and so, working from left to right until the whole page is assembled into master register 131. If two or more adjacent sectors, say A and B, are in the same row, these can either all be transferred together, or one at a time.

A number of additional features can be incorporated into present invention in alternate embodiments, several of which can incorporate architectural improvements presented in U.S. patent application Ser. No. 10/846,289 that was incorporated by reference above. These architectural features include the ability to allow Slave Data Register 135 to transfer data directly to the memory interface (without transfer first to the Master Data Register 131), a swap operation that exchanges the contents of the Slave Data Register 135 with those of the Master Data Register 131, the ability to directly transfer data between the Master Data Register 131 and the memory array 133 (without transferring through the Slave Data Register 135), and combinations of these.

More specifically, if there are more data registers available, when there is a selective single sector data transfer or/and swap mechanism with rotation, the method can easily be upgraded to do regrouping for more than one page in parallel. Additionally, if the memory allows parallel read or/and program of multiple pages, then the method can easily be upgraded to do concurrent on-chip garbage collection for multiple pages.

If the memory incorporates additional data registers where there is a data swap mechanism between them, or if it is possible to use more than one data register as a slave read/program register, then the methods of on-chip data alignment for on-chip garbage collection can be combined with the pipelined data relocation method of patent application Ser. No. 10/846,289. This would allow the majority of error checks and correction to be done in parallel with data programming, in the background. This combination can also be used for background data update or re-labeling, when the data should be modified before programming to a new location.

The embodiments discussed so far have implicitly taken all of the sectors forming a page to be part of the same cell array on the same memory chip. Other possible embodiments allow combining the benefits of the above-mentioned techniques and multi-chip parallel system configurations. In this case, the masking technique can be used in both chips, say to collect data page for a meta-block spanning over the two chip. The rotation technique can also be used if data re-alignment is necessary. The simplest example could be the one illustrated on FIG. 5, assuming that the left two planes make the first chip, and the right two planes make the second chip. Thus, the data spans over a meta-pages spanning two planes of two chips.

Figure 6:
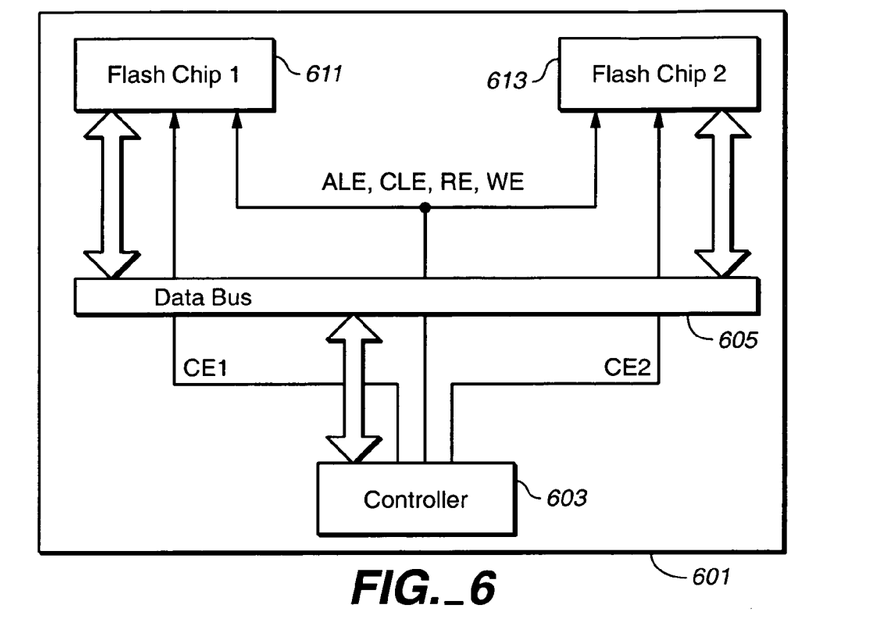
FIG. 6 shows an alternate multi-chip memory system architecture.

One method allowing the transfer of data from one chip to another chip are the off-chip copy techniques described in U.S. patent application entitled "Off-Chip Data Relocation" by Peter Smith and Kevin Conley, filed Dec. 21, 2004, incorporated by reference above. As described there in more detail, a data set can be transferred from a data register in on chip to a data register in another chip via a shared data bus without the need to temporarily store the data on the controller. FIG. 6 shows a memory system 601 having such an arrangement. A first memory chip 611 and a second memory chip 613 are connected by the common data bus 605, though with they are also connected to controller 603. Considering two planes from each memory chip as an example, a memory organization allowing data grouping and realignment is shown in FIG. 7.

Figure 7:
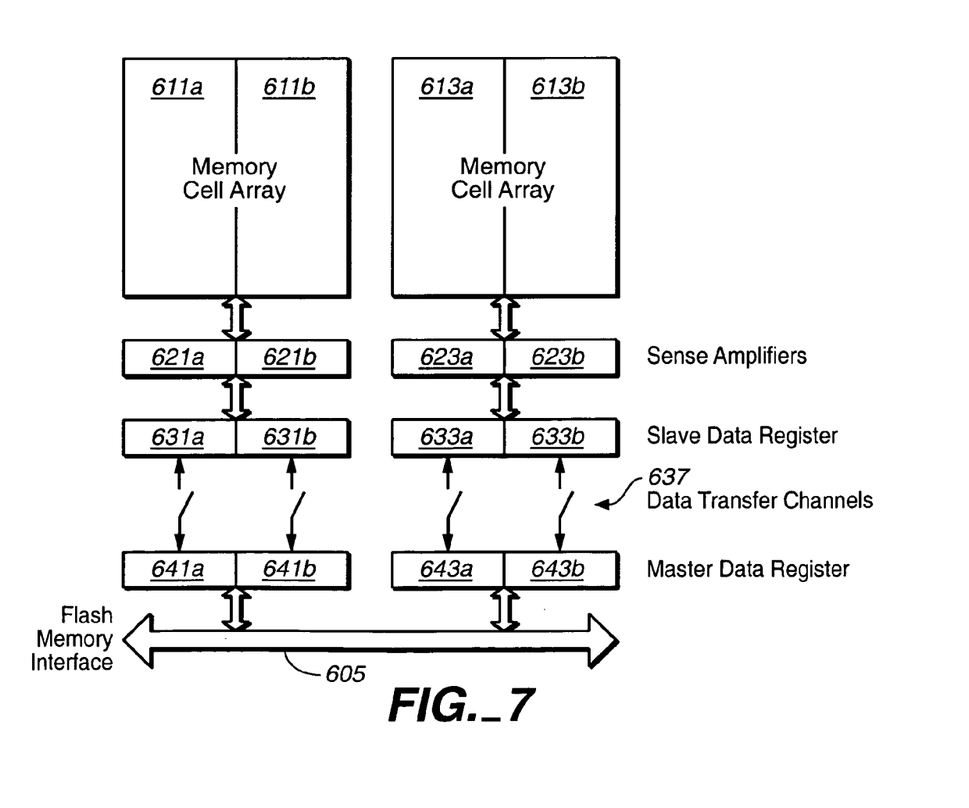
FIG. 7 illustrates a principle aspect of the present invention implemented in the architecture of FIG. 6.

FIG. 7 is similar to FIG. 4, but with the page now spread across multiple chips as a meta-page. Each sector (611a, 611b, 613a, 613b) is read through the corresponding sense amplifier (621a, 621b, 623a, 623b) into the corresponding slave data register (631a, 631b, 633a, 633b). According to first principle aspect of the present invention, each of the slave registers (631a, 631b, 633a, 633b) may be selectively transferred to the corresponding master data register (641a, 641b, 643a, 643b) according to the various masking mechanisms, and with the various generalizations, discussed above with respect to FIG. 4.

Figure 8:
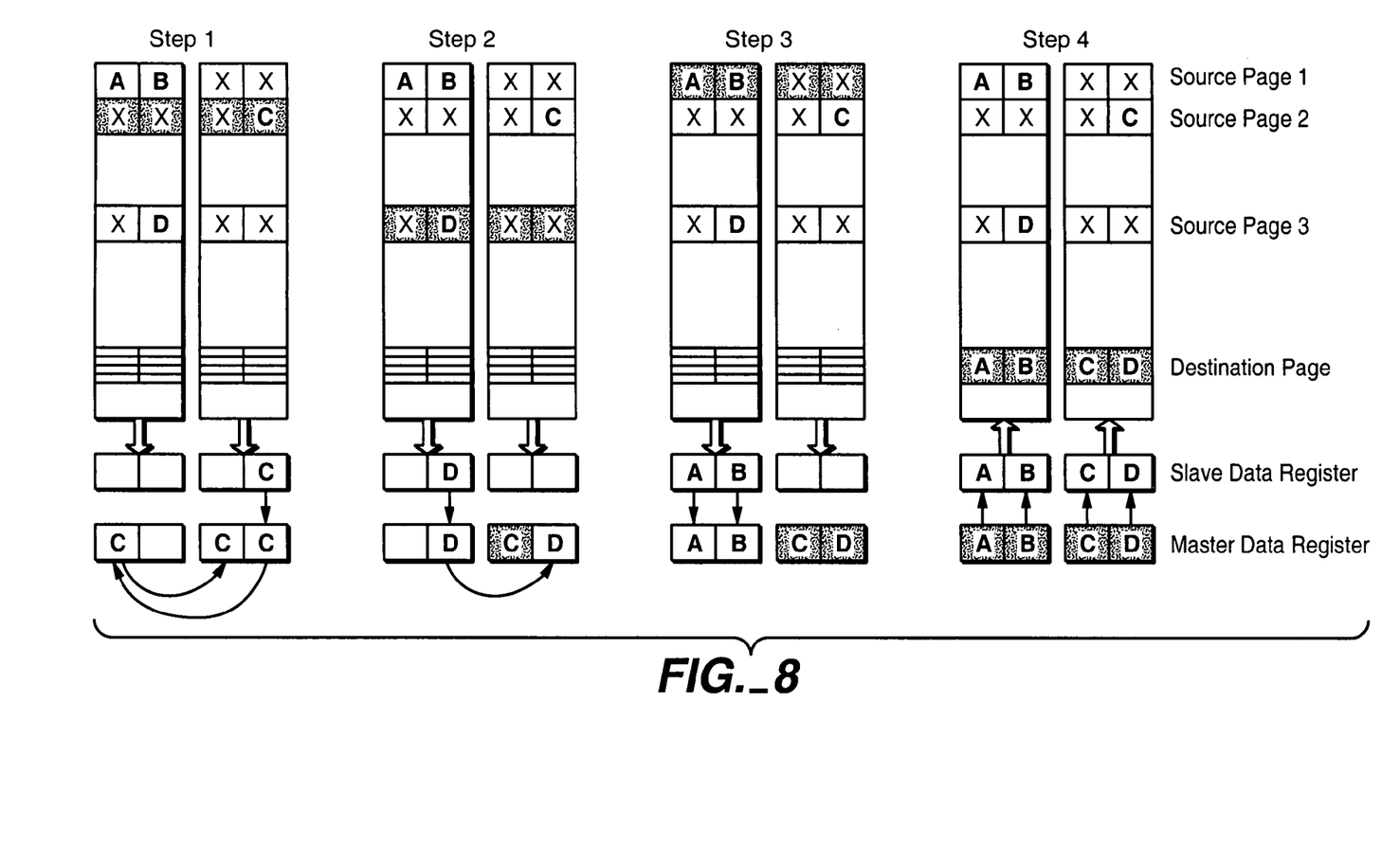
FIG. 8 illustrates an example of the operation of the memory shown in FIGS. 6 and 7.

As an example of a data regrouping for the same initial data arrangement as in to FIG. 5, but for a two-chip configuration with the off-chip copy mechanism is illustrated in FIG. 8. This can often be accomplished by use of the common data bus 605 without need of an internal data shift. In most cases it can be done by the means of the common bus and no internal shift mechanism is required. In the example, sector C is re-aligned by transfer to the other chip, and then transfer back, but to the different location.

In more detail, shows four planes with the sectors of interest again distributed as in FIG. 5, the difference being that the four planes are now split between two arrays connected as shown in FIG. 6. Using the chip to chip transfer mechanism of FIG. 6, the sectors can be grouped and aligned without use of the cyclically rotation of sectors in the master data register shown in FIGS. 4 and 5 for register 131. A first step has the components of transferring the row containing sector C to slave register 633, masking out the unwanted sector and selectively transferring C to master register 643*b*, and moving sector C to the desired location of 643*a* via a transfer to the other chip's slave register (here 641*a*, although 641*b* could be used instead). The swap between chips requires a bi-directional transfer, which can be achieved by interleaving data transfers in the differing directions.

In step 2, the row containing D is transferred to slave register 631, sector D is then moved to 641*b*, and then moved through bus 605 to it to its desired location of 643*a*. Sectors A and B are already aligned, so they can be transferred without any masking though slave register 631 to master register 641. At the end of step 3, the meta-page of data has been aligned and grouped together in the master data register. In step 4, it is shifted back to the slave register and written the destination page.

In some case, it may be be inconvenient or not readily possible to re-arrange the data with the off-chip copy mechanism alone. For example, if in the example, A and B are stored in the second chip, and C and D in the first one, then in order to relocate them to the opposite chip, either an additional temporary data storage buffer or a mechanism to swap data between chips (which in practice also needs at least one bit of extra temporary data storage) is needed.

The temporary storage buffer can be located outside memory chips, say in the controller, or in the memory chip itself. For example, the Slave Data Register 631 or 633 can be used as such temporary data storage element. One of the techniques described in U.S. patent applications Ser. No. 10/846,289, like data transfer between the Slave data register and IO port, or data swap between slave and master data registers, can be used to enable data transfer to the other chip.

Figure 9:
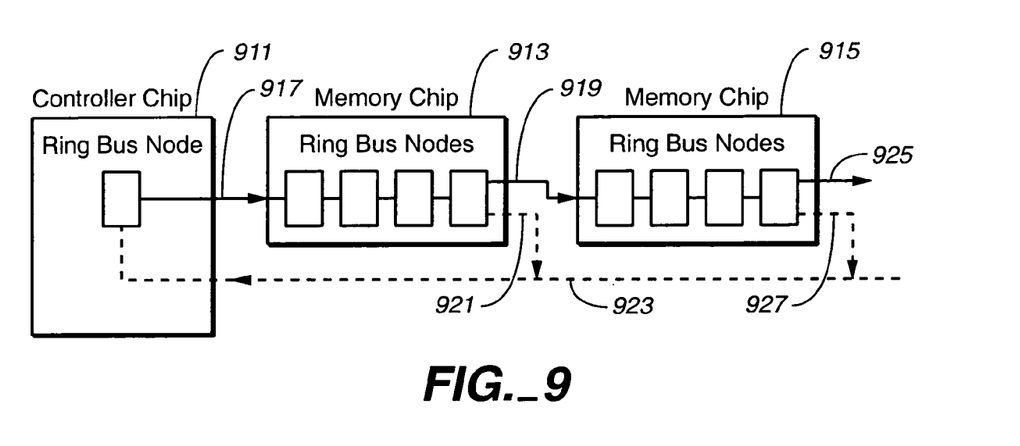
FIG. 9 shows another alternate multi-chip memory system architecture.
Figure 10:
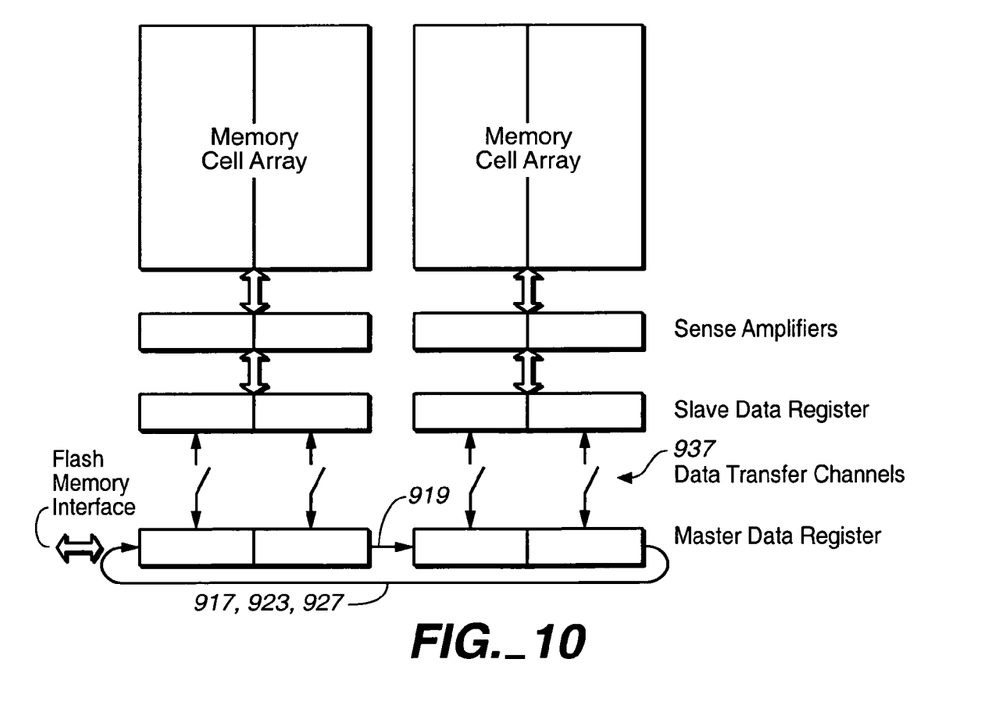
FIG. 10 illustrates an example of the operation of the memory shown in FIG. 9.

Another embodiment allowing efficient data regrouping can be based on the ring bus structure described in U.S. patent application Ser. No. 10/915,039, filed Aug. 9, 2004, which is hereby incorporated by reference. As described there in more detail, this structure allows data to be shifted in a cyclic manner between the registers of different chips. FIG. 9 can be used to briefly illustrate some of the relevant features. As shown in FIG. 9, the controller 911 and memory chips (913, 915) are connected in cyclic structure along the ring bus composed of segments 917, 919, 921, 923, 925, and 927. The "Ring Bus Nodes" can be taken to correspond to the master data registers. Considering a two-chip configuration, with two planes taken from each chip, the result shown in FIG. 10 is very similar to that shown in FIG. 4 for the single chip case. Here, the two parts of the combined master data register for the meta-page are connected by ring bus segment 919 and the loop back is composed of segments 917, 923, and 927. In this way, the operation becomes analogous to that shown in FIGS. 4 and 5.

As mentioned above, the discussion so far has referred mainly to embodiments based on flash EEPROM memory cells and have been described with respect to the type of cell that utilizes conductive floating gates as charge storage elements. However, the various aspects of the present invention can be used in conjunction with the various alternate non-volatile memory technologies (such as thin film, MRAM, FRAM, NMOS, etc.) described in U.S. patent application Ser. No. 10/841,379 filed May 7, 2004, which is hereby incorporated by reference. For example, the invention may also be implemented in a system that uses a charge trapping dielectric as the storage elements in individual memory cells in place of floating gates. Dielectric storage elements are also discussed further in the U.S. patent application Ser. No. 10/280,352, filed Oct. 25, 2002, which is hereby incorporated by this reference.

Although the invention has been described with respect to various exemplary embodiments, it will be understood that the invention is entitled to protection within the full scope of the appended claims.

It is claimed:

1. A method of operating a memory system including a memory array, comprising:
    reading a first multi-sector page of data from the memory array to a first data register;
    selectively transferring less than all of the sectors of the first page of data from the first data register to a second data register; and
    realigning sectors of the first page of data within one of said registers.

2. The method of claim 1, further comprising:
    concurrently with said realigning sectors of the first page of data, transferring sectors of the first page of data off of the memory.

3. The method of claim 2, wherein the memory system includes a memory controller and said transferred sectors of the first page of data are transferred to the memory controller, the method further comprising:
    performing in the controller an error detection and correction operation on said transferred sectors of the first page of data.

4. A method of operating a memory system including a memory array, comprising:
    reading a first multi-sector page of data from the memory array to a first data register;
    selectively transferring less than all of the sectors of the first page of data from the first data register to a second data register;
    subsequent to transferring the first page of data to the second data register, reading a second multi-sector page of data from the memory array to the first register; and
    selectively transferring less than all of the sectors of the second page of data from the first data register to portions of the second data register not containing data from the first page of data while maintaining said selectively transferred sectors of the first page of data in the second data register.

5. The method of claim 4, further comprising: prior to said selectively transferring sectors of the second page of data to the second data register, realigning sectors of the first page of data within one of said registers.

6. The method of claim 4, further comprising:
    concurrently writing the selectively transferred sectors of the first page of data and the selectively transferred sectors of the second page of data to the memory array.

7. A method of operating a memory system including a memory array, comprising:
    accessing a first multi-sector page of data from the memory array; and selectively transferring less than all of the sectors of the first page of data from the accessed first page to a first data register; and realigning sectors of the first page of data within one of said registers.

8. The method of claim 7, further comprising:

concurrently with said realigning sectors of the first page of data, transferring sectors of the first page of data off of the memory.

9. The method of claim 8, wherein the memory system includes a memory controller and said transferred sectors of the first page of data are transferred to the memory controller, the method further comprising:

performing in the controller an error detection and correction operation on said transferred sectors of the first page of data.

10. A method of operating a memory system including a memory array, comprising:

accessing a first multi-sector page of data from the memory array; and selectively transferring less than all of the sectors of the first page of data from the accessed first page to a first data register; and transferring portions of the first page of data from the first data register to a second data register;

subsequent to transferring portions of the first page of data to the second data register, accessing a second multi-sector page of data from the memory array; and selectively transferring less than all of the sectors of the second page of data from the accessed second page to the first data register; and selectively transferring portions of the second page of data from the first data register to portions of the second data register not containing data from the first page of data while maintaining said selectively transferred sectors of the first page of data in the second data register.

11. The method of claim 10, further comprising:

concurrently writing the selectively transferred sectors of the first page of data and the selectively transferred sectors of the second page of data to the memory array.

12. The method of claim 10, further comprising:

prior to transferring sectors of the second page of data to the second data register, realigning sectors of the first page of data within one of said registers.

13. A method of operating a memory system including a plurality of memories each including a memory array and first and second data registers, the method comprising:

performing a process in a first of said memories, including:

reading from the first memory's array a multi-sector portion of a first page of data to the corresponding first data register;

selectively transferring less than all of the read sectors of the first page of data from the first data register to the corresponding second data register;

subsequent to performing said process in the first memory, moving the selectively transferred portion of the first page from the second data register of the first memory to the second data register of a second of said memories;

subsequent to said moving the selectively transferring the portion first page of data, reading from one of the first or second memory's array a portion of a second page of data to the corresponding first data register; and transferring at least a portion of the second page of data from the corresponding first data register to the corresponding second data register while maintaining said selectively transferred sectors of the first page of data in one of said second data registers.

14. The method of claim 13, further comprising:

concurrently with moving the selectively transferred portion of the first page, transferring sectors of the first page of data off of the memory.

15. The method of claim 14, wherein the memory system includes a memory controller and said transferred sectors of the first page of data are transferred to the memory controller, the method further comprising:

performing in the controller an error detection and correction operation on said transferred sectors of the first page of data.

16. The method of claim 13, further comprising:

concurrently writing the selectively transferred sectors of the first page of data and the selectively transferred sectors of the second page of data to the first and second memory arrays as a meta-page of data.

17. The method of claim 13, wherein each of the memories is structured as a plurality of semi-autonomous arrays, each of said semi-autonomous arrays storing a single sector of each of said pages.

18. The method of claim 13, wherein each of the memories is structured as a plurality of semi-autonomous arrays, each of said semi-autonomous arrays storing multiple sectors of each of said pages.

19. A memory system, comprising:

a memory chip including:

a memory array;

a first multi-sector register, wherein a plurality of data sectors can be transferred in parallel between the first register and the array;

a second multi-sector register, wherein data can be transferred between the second register and externally to the memory and wherein a plurality of data sectors can be transferred in parallel between the first register and the second register, wherein the alignment of data sectors within one of the registers can be realigned.

20. The memory system of claim 19, further comprising:

a controller, wherein data can be transferred between the second register and the controller in parallel with realigning data sectors within one of the registers.

21. The memory system of either of claim 20, wherein the controller can perform an error detection and correction operation on data transferred from the memory to the controller.

22. A memory system, comprising:

a first memory including:

a memory array;

a first multi-sector register, wherein a plurality of data sectors can be transferred in parallel between the first register and the array;

a second multi-sector register, wherein data can be transferred between the second register and externally to the memory and wherein a plurality of data sectors can be transferred in parallel between the first register and the second register, wherein individual data sectors can be selectively transferred between the first register and the second register.

23. The memory system of claim 22, wherein the alignment of data sectors within one of the registers can be realigned.

24. The memory system of claim 23, further comprising:

a controller, wherein data can be transferred between the second register and the controller in parallel with realigning data sectors within one of the registers.

25. The memory system of either of claim 24, wherein the controller can perform an error detection and correction operation on data transferred from the memory to the controller.

26. The memory system of claim 22, wherein the memory is structured as a plurality of semi-autonomous arrays, each of said semi-autonomous arrays storing a single sector of each of said pages.

27. The memory system of claim 22, wherein the memory is structured as a plurality of semi-autonomous arrays, each of said semi-autonomous arrays storing multiple sectors of each of said pages.

28. The memory system of claim 22, further comprising:
a second memory including multi-sector register, wherein said selectively transferred data can be exchanged between the second register of the first memory and the register of the second memory.

29. The memory system of claim 22, further comprising:
a second memory including:
   a memory array;
   a first multi-sector register, wherein a plurality of data sectors can be transferred in parallel between the first register and the array;
   a second multi-sector register, wherein data can be transferred between the second register and externally to the memory and wherein a plurality of data sectors can be transferred in parallel between the first register and the second register,
   wherein individual data sectors can be selectively transferred between the first register and the second register of the second memory in parallel with selectively transferring individual data sectors between the first register and the second register of the first memory.

30. A memory system, comprising
a first memory including:
   a memory array;
   a first multi-sector register, wherein a plurality of data sectors can be transferred in parallel between the first register and the array, wherein individual data sectors can be selectively transferred between the memory array and the first register; and
   a second multi-sector register, wherein data can be transferred between the second register and externally to the memory and wherein a plurality of data sectors can be transferred in parallel between the first register and the second register,
   wherein the alignment of data sectors within one of the registers can be realigned.

31. The memory system of claim 30, further comprising:
a controller, wherein data can be transferred between the second register and the controller in parallel with realigning data sectors within one of the registers.

32. The memory system of either of claim 31, wherein the controller can perform an error detection and correction operation on data transferred from the memory to the controller.

33. A memory system, comprising:
a first memory including:
   a memory array;
   a first multi-sector register, wherein a plurality of data sectors can be transferred in parallel between the first register and the array, wherein individual data sectors can be selectively transferred between the memory array and the first register; and
   a second multi-sector register, wherein data can be transferred between the second register and externally to the memory and wherein a plurality of data sectors can be transferred in parallel between the first register and the second register; and
a second memory including multi-sector register, wherein said selectively transferred data can be exchanged between the second register of the first memory and the register of the second memory.

* * * * *

UNITED STATES PATENT AND TRADEMARK OFFICE
CERTIFICATE OF CORRECTION

| | | |
|---|---|---|
| PATENT NO. | : 7,212,440 B2 | Page 1 of 1 |
| APPLICATION NO. | : 11/026549 | |
| DATED | : May 1, 2007 | |
| INVENTOR(S) | : Anatolievich | |

It is certified that error appears in the above-identified patent and that said Letters Patent is hereby corrected as shown below:

Title Page, Item [56] under the heading Foreign Patent Documents, please delete "WO 99/44133" and insert --WO 99/44113--.

Signed and Sealed this

Tenth Day of March, 2009

JOHN DOLL
*Acting Director of the United States Patent and Trademark Office*